US006906406B2

(12) United States Patent
Hwang et al.

(10) Patent No.: US 6,906,406 B2
(45) Date of Patent: Jun. 14, 2005

(54) MULTIPLE DICE PACKAGE

(75) Inventors: Lih-Tyng Hwang, Crystal Lake, IL (US); James E. Drye, Mesa, AZ (US); Shun Meen Kuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 10/324,533

(22) Filed: Dec. 19, 2002

(65) Prior Publication Data

US 2004/0119150 A1 Jun. 24, 2004

(51) Int. Cl.[7] .............................................. H01L 21/44
(52) U.S. Cl. ..................................... 257/685; 257/701
(58) Field of Search ................................ 257/684–686, 257/701–703

(56) References Cited

U.S. PATENT DOCUMENTS 5,138,436 A * 8/1992 Koepf ........................ 257/728
5,422,435 A * 6/1995 Takiar et al. ............... 174/52.4
5,701,233 A * 12/1997 Carson et al. .............. 361/735

* cited by examiner

*Primary Examiner*—Leonardo Andujar

(57) ABSTRACT

A semiconductor device for multiple dice is provided that reduces insertion loss and return loss. In an example embodiment, the semiconductor device comprises: a package 20 comprising a mount surface 14 to which dice 61 and 65 are mounted, and a bond pad surface 25 defining at least a first die area 27 and a second die area 29, wherein the second die area 29 is different in form from the first die area 27.

10 Claims, 3 Drawing Sheets

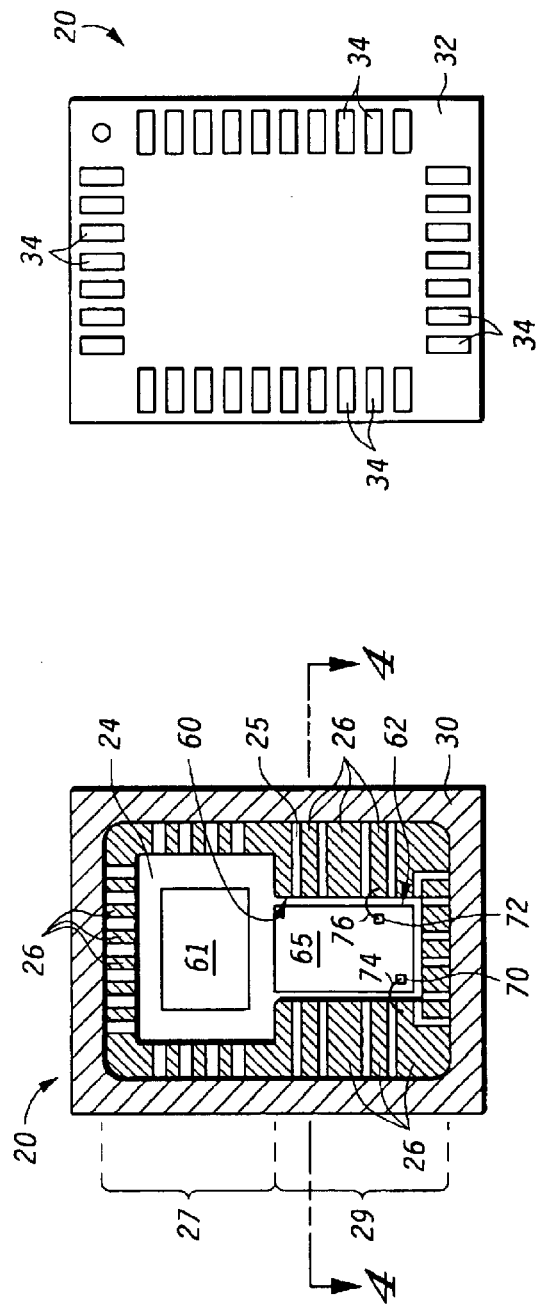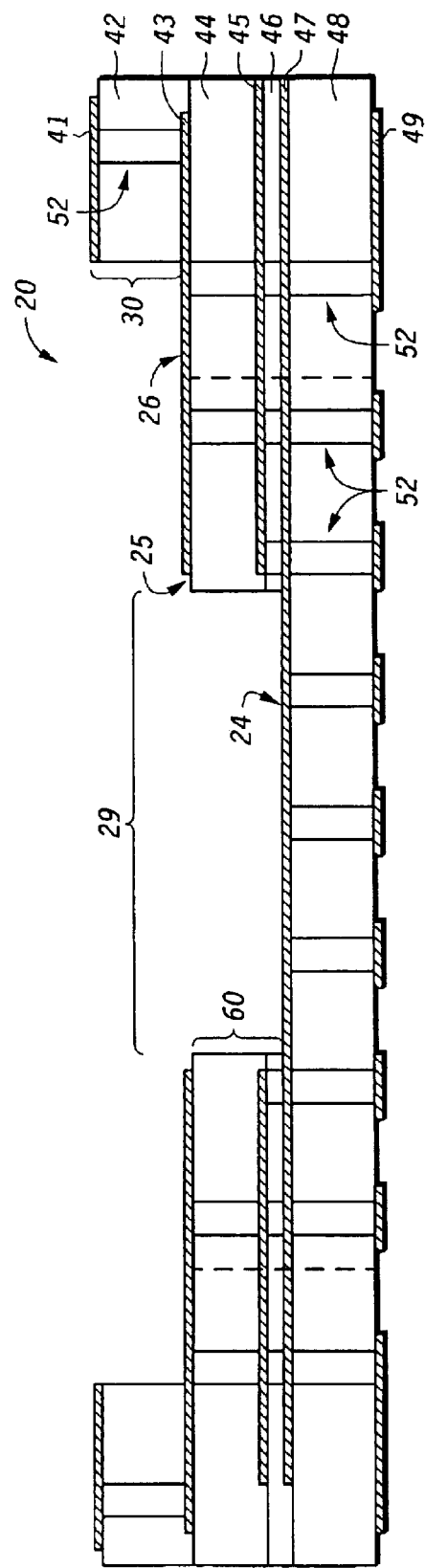

MULTIPLE DICE PACKAGE

BACKGROUND

The present invention relates to packages for integrated circuits and more particularly to packages for holding multiple integrated circuit dice.

FIG. 1 shows an illustration of an example of a prior art package 10 in which an integrated circuit control die 12 is mounted on mounting surface 14 along with radio frequency ("RF") microelectromechanical device (a.k.a. "MEMS") die 16. Bond wires 17 connect the bond pads 18 of the dice 12 and 16 to each other and to the bond pads 19 of-the package body.

Packages such as that illustrated in FIG. 1 have limitations. For example, depending on the devices mounted in the package and the frequencies of interest, the "insertion loss" for a packaged device is about 0.4 dB, of which 0.2 dB is attributed to the device. Therefore, the package can have only about 0.2 dB of insertion loss, and it is desirable to have as little insertion loss as possible. Further, control of impedance of the package is difficult, resulting in significant "return loss."

BRIEF DESCRIPTION OF DRAWINGS

FIG. 2 is a top view of an example embodiment of the invention.

FIG. 3 is a bottom view of an example embodiment of the invention.

FIG. 4 is a sectional view of the example embodiment of FIG. 2.

DETAILED DESCRIPTION OF EXAMPLE EMBODIMENTS

Figure 1:
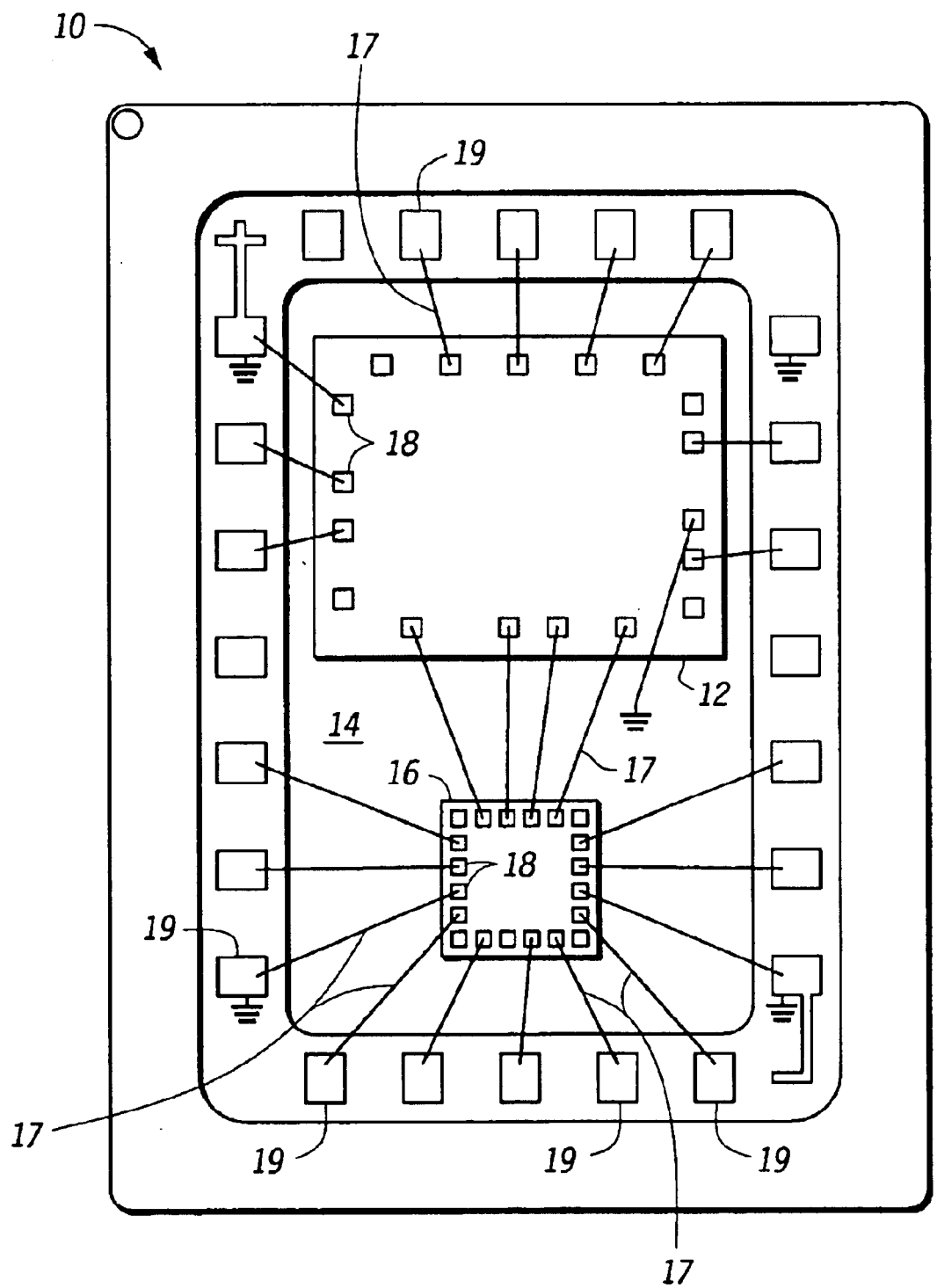
FIG. 1 is a top view of the prior art.

FIG. 2 is a top view of a package 20 having a mount surface 24 above which bond pad surface 25 resides. The openings in surface 25 define a cavity having a first die area 27 and a second die area 29. Seal ring 30 resides above bond pad surface 25. A first semiconductor die 61 is mounted in first die area 27, and a second semiconductor die 65 is mounted in second die area 29. Second semiconductor die 65 includes die bond pads 70 and 72, which are electrically connected to package bond pads 26 with bond wires 74 and 76. Typical examples of dice 61 and 65 actually include more than two bond pads; however, for simplicity, the additional die bond pads and the bond wires have not been shown. FIG. 3 is a bottom view of the package 20, illustrating a ceramic base 32 having package pad metal connectors 34 connected through vias (not shown) to package bond pads 26 (FIG. 2).

FIG. 4 is a cross-sectional view of package 20 of FIG. 2, taken along line 4—4 (excluding die 65). In FIG. 4, the seal ring 30 of FIG. 2 comprises a seal ring metal 41 that resides on a seal ring ceramic 42. In this example, seal ring ceramic 42 comprises four layers of ceramic tape, fired to become ceramic 42. Seal ring ceramic 42 resides above bond layer metal 43 on a three-layer cavity ceramic 44; again the layers are fired to form the final ceramic 44. Bond metal layer 43 forms bond pads 26 of FIG. 2. A ground layer metal 45 is seen above a single-layer cavity ceramic 46 that separates ground layer metal 45 from die bond metal 47 of mount surface 24. A three-layer ceramic base 48 separates ground layer metal 45 from the back surface of the package (not shown) to which package pad metal connectors 49 are applied. As with the ceramic layers 42 and 44, the layers of base 48 comprise so-called "green tape" that becomes a substantially uniform ceramic layer upon firing. Vias 52 provide electrical connection between the various metal layers within the ceramic package. In a detailed example, for an RF MEMS package having a 0.5 mm pitch, the specific dimensions are: a 5.4 mm package width, 0.282 mm of ceramic base 48, 0.94 mm of the single layer of ceramic 46, 0.282 mm of the three-layer ceramic 44, and 0.376 mm of seal ring ceramic 42.

Referring again to the example of FIG. 2, second die area 29 is different in form from first die area 27. In the illustrated example, it is smaller, although, in alternative embodiments, the second die area 29 is larger, has the same area with a different shape, and/or has other differences. In the illustrated example, second die area 29 is conformed to the shape of the die 65 that is mounted to the mounting surface 24. In many examples, a bond surface edge 60 is less than about fifty microns from the edge 62 of the die 65. In some examples, bond surface edge 60 is less than about twenty microns from the edge 62 of the die 65. In still further examples bond surface edge 60 is between about fifty and about twenty microns from edge 62.

Reduction of the distance between a die and a package bond pad reduces the wire bond distance (e.g., the length of the wire bonds 74 or 76 needed to connect die bond pads 70 or 72 of die 65 with a package bond pad 26). Long wire bonds have been found to cause much of the insertion loss problems; reduction of wire bond distance reduces the insertion loss. Further, it is difficult to control the impedance of long wire bonds, and it is difficult to control the return loss caused by any mismatch of impedance between the package and dice, on the one hand, and other components with which the package is interconnected, on the other. Therefore, an impedance system that comprises a wire bond and a package bond pad is dominated, in some embodiments, by the impedance of the package bond pad. The short wire bond distance allows control of impedance through control of the impedance of the bond pads 26 on surface 25 and the impedance of the rest of package 20. Variation of the impedance of the rest of the package is achieved, in some embodiments, by variation of the vertical position of the ground layer metal 45. It has been found that a wire bond distance under about two millimeters allows the package impedance to dominate in many examples; while, in some other examples, a wire bond distance of less than about one millimeter is appropriate. In still further embodiments, other arrangements and/or means are used to allow the impedance of the package bond pads to dominate.

Referring still to the example of FIG. 2, the package bond pads 26 of the first die area 27 are substantially the same shape, at least on any particular edge of first die area 27. The package bond pads 26 of the second die area 29, however, have differing shapes and sizes. The variety in shape, in this example, controls the impedance of the bond pad, thus allowing impedance control of the package and reducing return loss. For example, some of the package bond pads 26 are rectangular, and some have more than four sides. Also, in at least one specific embodiment, at least one of the package bond pads having more than four sides comprises a ground pad (e.g., connected to die bond pad 70 via bond wire 74), while at least one of the smaller, rectangular bond pads comprises a signal pad (e.g., connected to die bond pad 72 via wire 76). In still further examples, other shapes, sizes, and assignments of function to package bond pads 26 are used.

Referring again to the example of FIG. 4, impedance control is enhanced in some embodiments through the use of a ground plane or ground layer 45, positioned in this example between bond layer metal 43 and die bond metal 47. The actual amount of ground layer metal 45 and the distance between ground layer metal 45 and metals 43 and 47 depend on the devices and applications of the package along with the dielectric and number of layers of ceramic or other material used between metals 43, 45 and 47. In alternative examples, metals 43, 45, and 47, are replaced with conductors other than metal, as are other metals seen in FIG. 4.

In still further examples, the materials used to provide the conducting, dielectric, and insulating materials are varied to control the impedance of the package, alone or in combination with the shape of package bonding pads 26. The specific materials and shapes vary according to the type of devices (e.g., RF, MEMS, or other) to be used and the specific frequencies of operation that are anticipated. In many examples, the package bond pads of second area 29 will have a variety of impedances that are substantially different from each other.

In many RF embodiments (e.g., MEMS applications), in which a control integrated circuit is mounted in the first die area 27, control of impedance of the control die is not a critical issue. Therefore, as discussed with regard to the example seen in FIG. 2, the package bond pads 26 of the first die area 27 are substantially the same shape; they have about the same impedance. In alternative embodiments, however, impedance of the package bond pads 26 of the first area 27 does matter. In some such embodiments, some or even all of the package bond pads 26 of the first die area 27 are of varying shape and impedance.

Therefore, according to a variety of embodiments, at least two of the package bond pads 26 of the first area 27 have impedances that are different from each other. In further embodiments, at least two of the package bond pads 26 of the second area 29 have impedances that are different from each other. In still a further example, at least one of the first area package bond pads 26 has an impedance that is different from at least one of the second area package bond pads 26.

Although the example of FIG. 2 shows a closely conformed recess of the bonding surface for the second die area, in further examples, both die areas have recesses in the bonding surface closely conformed to the shape of the die expected to be mounted in the package.

Figure 5:
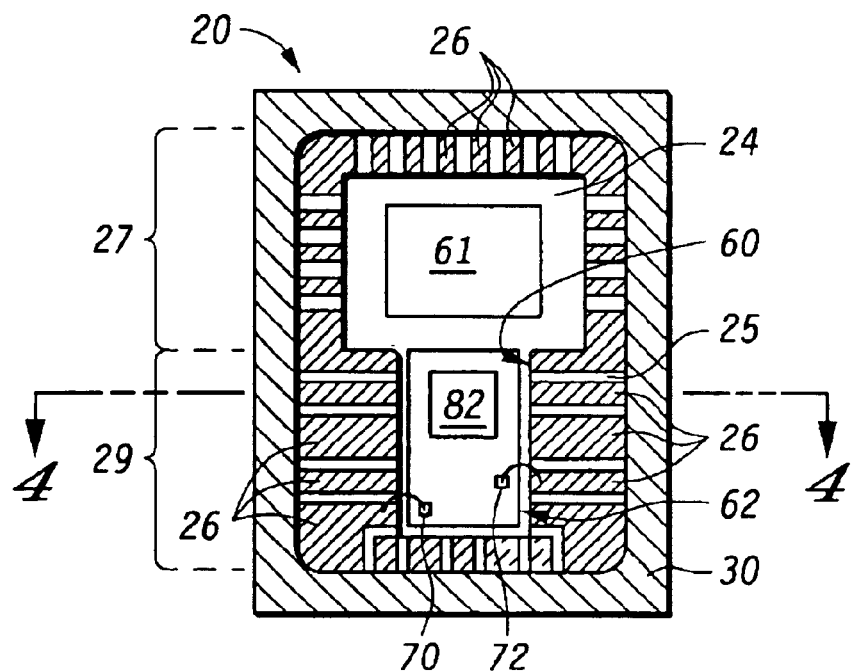
FIG. 5 is a top view of an example embodiment of the invention.
Figure 6:
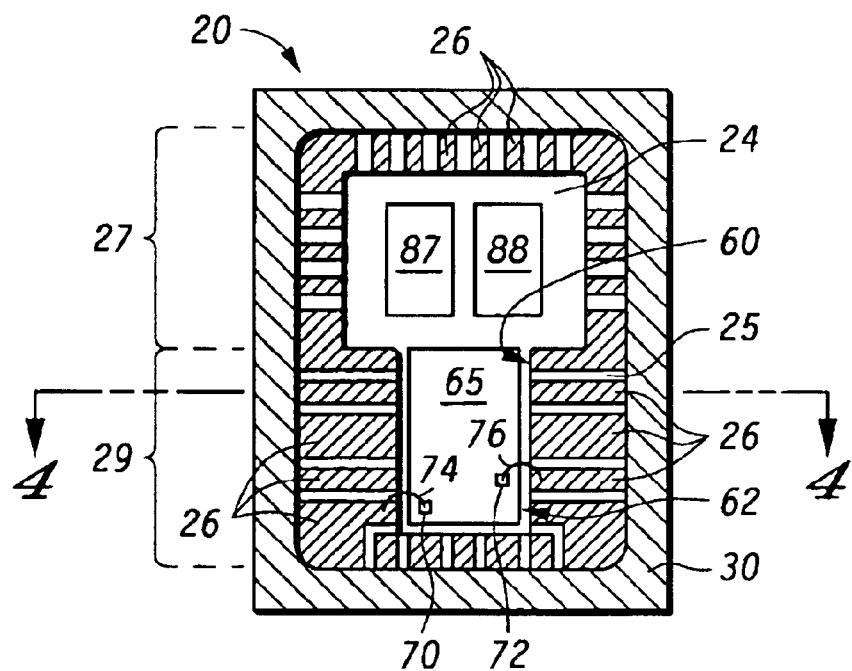
FIG. 6 is a top view of an example embodiment of the invention.

The illustrations have shown a two-dice example. In further embodiments (not shown), more dice are used. For example, in some embodiments, a third die is stacked on a control die in area 27 of FIG. 2 (e.g. a saw filter). Another example, as shown in FIG. 5, includes use of an integrated passive device (IPD) 81 as the die mounted in area 29 with a MEMS switch 82 stacked on the IPD. In an even further example as shown in FIG. 6, multiple control dice (control die 87 and control die 88) are mounted, unstacked, in area 27.

The example embodiments of the present invention have been described with a certain degree of particularity; however, many changes may be made in the details without departing from the scope of the invention. Still further examples will occur to those of skill in the art; a list of all possibly foreseeable examples is impractical here. The invention is not limited to the embodiments set forth herein; it is to be limited only to the scope of the attached claims, including the full range of equivalency to which each claim element is entitled.

What is claimed is:

1. A package for multiple semiconductor dice, the package comprising:
    a die mount surface;
    a bond pad surface residing over the die mount surface, wherein the bond pad surface includes a cavity having
        a first portion defining a first generally rectangular die receiving area and
        a second portion defining a second generally rectangular die receiving area, and
        wherein the first and the second die receiving areas have differing dimensions;
    a first semiconductor die mounted to the die mount surface in the first generally rectangular die receiving area and a second semiconductor die mounted to the die mount surface in the second generally rectangular die receiving area;
    a first set of package bond pads on the bond pad surface proximate to the first portion of the cavity; and
    a second set of package bond pads on the bond pad surface proximate to the second portion of the cavity, wherein each of the second set of package bond pads is implemented in an electrical pathway electrically coupled to a bond pad of the second semiconductor die, wherein each package bond pad of the second set has an impedance sized for controlling the impedance of the electrical pathway in which it is implemented;
    a third semiconductor die located in the first generally rectangular die receiving area;
    wherein the third semiconductor die is mounted to the die mount surface.

2. A package as in claim 1 wherein at least one of the first set of package bond pads on the bond pad surface has an impedance different from the impedance of at least one of the second set of package bond pads on the bond pad surface.

3. A package as in claim 1 wherein at least one of the first set of package bond pads on the bond pad surface has an impedance different from the impedance of another of the first set of package bond pads on the bond pad surface.

4. A package as in claim 1 wherein at least one of the second set of package bond pads on the bond pad surface has an impedance different from the impedance of another of the second set of package bond pads on the bond pad surface.

5. A package as in claim 1 wherein the second semiconductor die is less than about 50 microns from the bond surface.

6. A package as in claim 5 wherein the second semiconductor die is more than about 20 microns from the bond surface.

7. A package as in claim 1 further comprising a wire bond between a die bond pad on the second semiconductor die and a package bond pad, wherein the wire bond is less than about 2 millimeters in length.

8. A package as in claim 7 wherein the wire bond is less than about 1 millimeter in length.

9. A package as in claim 1 wherein the first semiconductor die comprises a control device and the second semiconductor die comprises a RF device.

10. A package as in claim 9 wherein the RF device comprises a MEMS device.

* * * * *